(12) United States Patent
Gupta et al.

(10) Patent No.: US 10,761,281 B1
(45) Date of Patent: Sep. 1, 2020

(54) OPTICAL MODULE PLUG FOR OPEN OPTICAL MODULE PORT

(71) Applicant: CISCO TECHNOLOGY, INC., San Jose, CA (US)

(72) Inventors: Rohit Dev Gupta, Bangalore (IN); Joel Richard Goergen, Soulsbyville, CA (US); Chezhian Barathi, Bangalore (IN)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/428,550

(22) Filed: May 31, 2019

(51) Int. Cl.
| | |
|---|---|
| *G02B 6/42* | (2006.01) |
| *G02B 6/38* | (2006.01) |
| *H01R 13/64* | (2006.01) |
| *H01R 13/659* | (2011.01) |
| *H04B 10/40* | (2013.01) |
| *H05K 7/20* | (2006.01) |

(52) U.S. Cl.
CPC ......... *G02B 6/4268* (2013.01); *G02B 6/3849* (2013.01); *G02B 6/3897* (2013.01); *G02B 6/4277* (2013.01); *G02B 6/4284* (2013.01); *H01R 13/64* (2013.01); *G02B 6/3825* (2013.01); *G02B 6/3879* (2013.01); *H01R 13/659* (2013.01); *H04B 10/40* (2013.01); *H05K 7/20* (2013.01)

(58) Field of Classification Search
None
See application file for complete search history.

(56) References Cited

U.S. PATENT DOCUMENTS

| | | | | |
|---|---|---|---|---|
| 5,879,173 | A  * | 3/1999 | Poplawski | G02B 6/4246 |
| | | | | 439/138 |
| 6,985,668 | B2 * | 1/2006 | Mazotti | G02B 6/4246 |
| | | | | 385/146 |
| 7,164,840 | B2 | 1/2007 | Hsieh | |
| 9,341,794 | B1 * | 5/2016 | Curtis | G02B 6/4269 |
| 9,345,158 | B2 * | 5/2016 | Shao | H05K 5/03 |
| 9,977,193 | B2 | 5/2018 | Abe | |
| 10,090,623 | B2 | 10/2018 | Campschroer | |
| 2003/0002824 | A1* | 1/2003 | Chan | G02B 6/4277 |
| | | | | 385/92 |
| 2018/0116063 | A1* | 4/2018 | Tracy | H05K 7/1427 |

* cited by examiner

*Primary Examiner* — Jerry Rahll
(74) *Attorney, Agent, or Firm* — Cindy Kaplan (57) ABSTRACT

In one embodiment, a method includes identifying optical transceivers installed in optical module ports at a network device based on input received at electrical interfaces at the network device, identifying at least one optical module port without an optical transceiver installed, determining if a plug is inserted into the optical module port, wherein an electrical signal indicates insertion of the plug into the optical module port, and raising an alarm if the optical module port is open. Insertion of the plug into the optical module port reduces airflow bypass, electromagnetic interference leakage, and contamination without the optical transceiver installed in the optical module port. The plug is also disclosed herein.

20 Claims, 10 Drawing Sheets

OPTICAL MODULE PLUG FOR OPEN OPTICAL MODULE PORT

TECHNICAL FIELD

The present disclosure relates generally to communications networks, and more specifically, to protecting open optical module ports in network equipment.

BACKGROUND

Over the past several years, there has been a tremendous increase in the need for higher performance communications networks. To satisfy the increasing demand of bandwidth and speed, pluggable transceiver modules (optical modules) are being used in network equipment (e.g., switches, routers, etc.) The line card may have various port configurations and not all ports may be populated with optical transceivers, resulting in one or more open ports. The open ports are a source of airflow leakage, which may impact cooling performance of the operating optical modules and may also lead to EMI (Electromagnetic Interference) leakage and contamination, thereby impacting standard compliance and reliability.

BRIEF DESCRIPTION OF THE DRAWINGS

Corresponding reference characters indicate corresponding parts throughout the several views of the drawings.

DESCRIPTION OF EXAMPLE EMBODIMENTS

Overview

In one embodiment, an apparatus generally comprises a plug for insertion into an optical module port on a network device configured to receive an optical transceiver and an electrical connector for connecting the plug to an optical transceiver interface on the network device and identifying insertion of the plug into the optical module port. Insertion of the plug into the optical module port reduces airflow bypass, electromagnetic interference leakage, and contamination without the optical transceiver installed in the optical module port.

In one or more embodiments, the electrical connector comprises a microcontroller or programmable memory and may comprise shorted signal pins.

In one or more embodiments, the apparatus comprises a status light for indicating proper insertion of the plug into the optical module port.

In one or more embodiments, a front surface and an upper surface of the plug comprise ventilation holes. The front surface of the plug extending from the optical module port when the plug is inserted into the port may comprise a movable screen for adjusting the airflow bypass through the ventilation holes.

In one or more embodiments, the plug comprises a latch for retaining the plug in the optical module port.

In one or more embodiments, the plug is configured to stabilize a heat sink attached to an optical module cage comprising the optical module port.

In another embodiment, an apparatus generally comprises a plug for insertion into an optical module port on a network device configured to receive an optical transceiver, and a switch contact for interface with a switch on the network device to indicate insertion of the plug into the optical module port. Insertion of the plug into the optical module port reduces airflow bypass, electromagnetic interference leakage, and contamination without the optical transceiver installed in the optical module port.

In yet another embodiment, a method generally comprises identifying optical transceivers installed in optical module ports at a network device based on input received at electrical interfaces at the network device, identifying at least one optical module port without an optical transceiver installed, determining if a plug is inserted into the optical module port, wherein an electrical signal indicates insertion of the plug into the optical module port, and raising an alarm if the optical module port is open. Insertion of the plug into the optical module port reduces airflow bypass, electromagnetic interference leakage, and contamination without the optical transceiver installed in the optical module port.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Pluggable optical modules (transceiver modules, optical transceivers) come in many different form factors such as SFP (Small Form-Factor Pluggable), QSFP (Quad Small Form-Factor Pluggable), QSFP+, QSFPDD (QSFP Double Density), QSFP28, CFP (C Form-Factor Pluggable), CFP2, CFP4, CFP8, CPAK, OSFP (Octal Small Form-Factor Pluggable), and the like, and may support data rates up to 400 Gb/s, for example. The pluggable transceiver modules operate as an engine that converts electrical signals to optical signals or in general as the interface to the network element copper wire or optical fiber. Hosts for these pluggable modules include line cards (line cards, fabric cards, controller cards, etc.) used on switches, routers, edge products, and other network devices.

Network communications devices (network devices, network equipment, line cards) may include any number of ports for receiving any number of optical transceivers. The network device may operate without all of the ports populated as there may be different port configurations (e.g., muxponder/transponder combinations) and licensing strategies. These open ports may lead to airflow bypass (e.g., airflow leakage, airflow unbalance) and disrupt the flow of cooling airflow over installed optical transceivers, thereby impacting cooling performance of the optical transceivers. The open ports may also allow for EMI (Electromagnetic Interference) leakage (e.g., through EMI fingers on optical module cages and mechanical gaps between heat sink and cage) and entry of dust or other contaminants into the system, thereby impacting reliability and possibly contributing to non-compliance with regulatory requirements. For example, equipment such as cell site routers or mobile backhaul applications may be installed in an outdoor environment and exposed to dust and moisture, which may lead to corrosion of internal components. In conventional systems, dust caps may be placed on empty ports, but these are often misplaced or simply left off, with only a visual check available to determine if the caps are properly installed, and even if installed, there may still be stability issues with heat sinks as described below.

Another issue that may arise with open ports is heat sink stability. While some optical modules may operate without heat sinks (e.g., SFP, QSFP, QSFP+), other optical modules may operate with riding heat sinks (e.g., QSFPDD), or integrated heat sinks (e.g., OSFP). Riding heat sinks may be assembled, for example, with a spring clip on an optical module cage to allow for movement during module insertion and extraction. When the optical module port is empty, there is an increased risk of detachment of the heat sink during shipment or movement of the network device since the spring clip allows the heat sink to vibrate when the port is empty, which may lead to a loose clip and detachment of the heat sink due to vibration or shock. Similar issues may arise during MDVT (Mechanical Design Validation Test) when test configurations do not have all of the optical transceivers inserted.

The embodiments described herein provide an optical module plug for insertion into an empty optical module port and configured for detection by the network device to reduce the likelihood of system operation without the optical module plug in place. The optical module plug prevents airflow bypass, which helps to maintain system thermal performance, prevents EMI leakage thereby reducing the likelihood of standard noncompliance, and protects against contamination (e.g., dust accumulation and corrosive contamination), which improves reliability in an unprotected environment. As described in detail below, the optical module plug may comprise electronics for interface with the host to identify insertion of the plug (active detection) or may be configured to interact with a switch (e.g., mechanical switch, proximity or other type of sensor) on the host to identify insertion of the plug (passive detection). If the network device detects that an optical module plug is missing from an empty optical module port, an alarm may be raised to alert a system operator or maintenance personnel. In one or more embodiments, an indicator (e.g., green light) may be used to identify proper installation of the optical module plug and simplify visual confirmation, which may be used by the operator to verify optical module plugs are inserted into all empty ports (i.e., ports without optical transceivers installed) when troubleshooting thermal alarms.

Figure 1A:
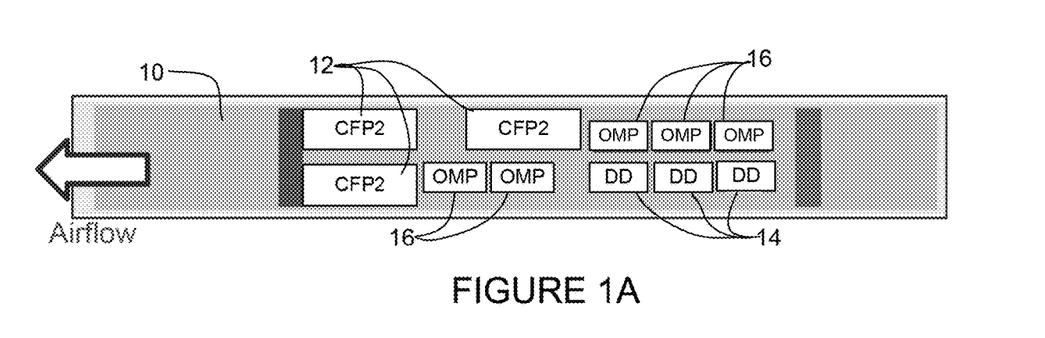
FIG. 1A is a schematic front view of a line card with a plurality of optical transceivers installed and optical module plugs inserted into empty ports, in accordance with one embodiment.
Figure 1B:
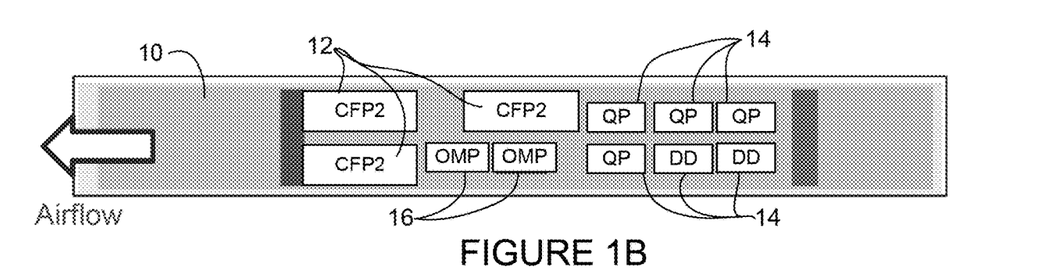
FIG. 1B is a schematic front view of another example of the line card with a plurality of optical transceivers installed and optical module plugs inserted into empty ports.
Figure 1C:
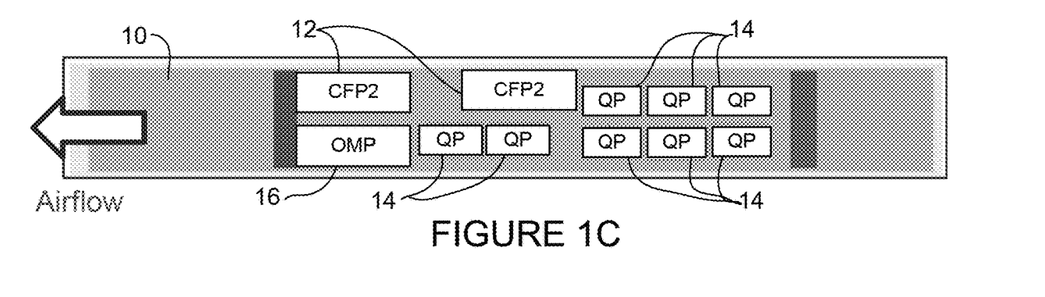
FIG. 1C is a schematic front view of another example of the line card with a plurality of optical transceivers installed and optical module plugs inserted into empty ports.

Referring now to the drawings, and first to FIGS. 1A, 1B, and 1C, a network device 10 comprising a plurality of optical module ports for receiving optical transceivers (also referred to as optical modules, pluggable modules, optics modules, pluggable optical modules (e.g., SFP, OSFP, QSFP, QSFP+, QSFPDD, QSFP28, CFP, CFP2, CFP4, CFP8, CPAK, and the like)) is shown. In this example, the network device 10 is configured for receiving three CFP2 modules 12 and eight QSFP modules 14 (e.g., QSFP (QP) or QSFPDD (DD)). It is to be understood that this is only an example and the network device 10 may be configured for receiving any number or type of optical transceivers arranged in any format.

The optical module ports shown in FIGS. 1A-1C each have an optical transceiver (e.g., CFP2 12, QP or DD 14) or an optical module plug (OMP) 16 installed therein. The optical transceivers 12, 14 and optical module plugs 16 are inserted into optical module cages comprising the ports, as described below with respect to FIGS. 2A-2C. The optical transceivers 12, 14 may be configured to support gigabit Ethernet, Fibre Channel, or other communications standards. The optical transceivers 12, 14 may comprise one or more front connectors (e.g., LC or other suitable connector)

(not shown) for communication with other network devices. The optical module cage comprises connectors (interfaces) for connecting the optical transceivers 12, 14 with electronic components on a line card or other electronic component (host) operable to utilize transceivers and interface with a telecommunications network. As described below with respect to FIGS. 3A-5C, the optical module plug 16 may also comprise an electrical connector for communication with the host.

In the examples shown in FIGS. 1A-1C, cooling airflow enters the right side of the network device 10 (as viewed in FIGS. 1A-1C) and exits the left side of the network device (as indicated by the arrows in FIGS. 1A, 1B, and 1C). If any of the optical module ports are open, airflow bypass (leakage) may occur through the open ports.

In the example shown in FIG. 1A, five of the QSFP ports do not have optical transceivers installed. The optical module plug (OMP) 16 is inserted into each of the empty ports to prevent airflow bypass, EMI leakage, and system contamination without the optical transceiver installed in the port. In the example shown in FIG. 1B, two of the QSFP ports do not have optical transceivers installed and the optical module plugs 16 are inserted into the empty ports. In the example shown in FIG. 1C, one of the CFP ports does not have a transceiver installed and the optical module plug 16 is inserted therein.

As noted above, the configurations shown in FIGS. 1A-1C are only examples, and any number or combination of optical transceivers may be installed with the optical module plugs installed in the empty ports having no transceiver installed. Also, it should be noted that the side-to-side airflow shown in FIGS. 1A-1C is only an example. In another example, airflow may enter a front panel and exit a rear panel (front-to-back airflow). It is to be understood that the terms front, back, side, or upper as used herein are relative to the position and orientation of the line card or network device and are not to be interpreted as limiting the arrangement of components or airflow through the system.

Figure 2A:
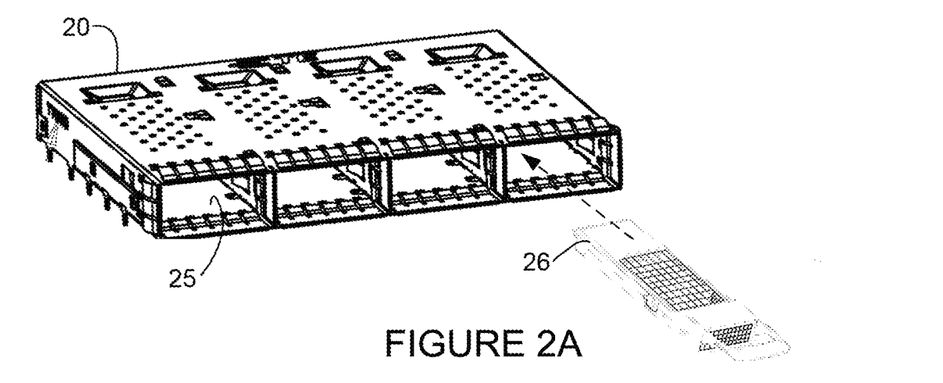
FIG. 2A is a perspective of an optical module cage and an optical module plug, in accordance with one embodiment.
Figure 2B:
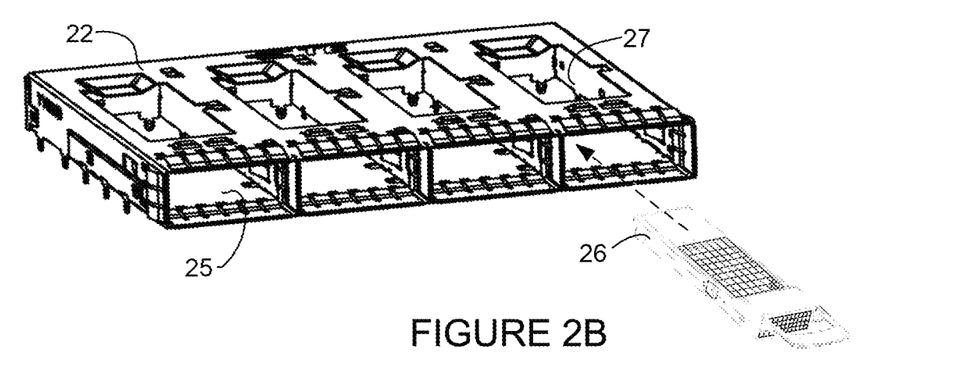
FIG. 2B is a perspective of an open top optical module cage and the optical module plug.
Figure 2C:
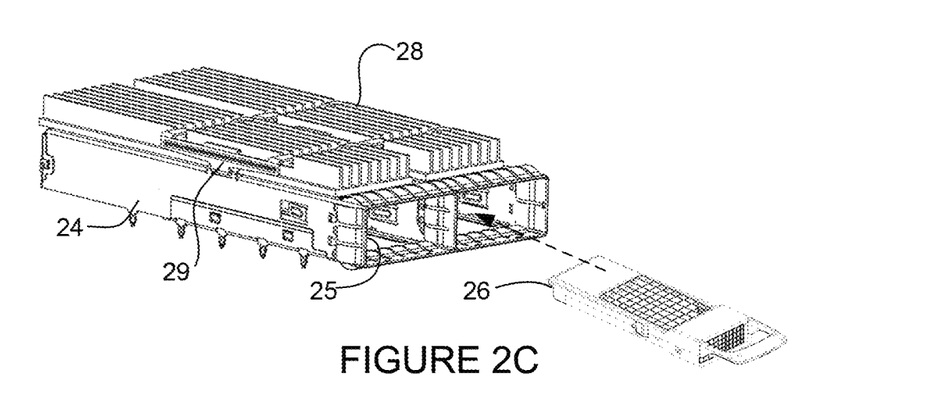
FIG. 2C is a perspective of an open top optical module cage with heat sinks installed and the optical module plug.

FIGS. 2A, 2B, and 2C illustrate examples of optical module cages with a closed top, open top, and heat sinks installed, respectively. The optical module cage 20, 22, 24 comprises a first opening (port) 25 for slidably receiving the optical transceiver (not shown) or optical module plug 26 and may also include a second opening 27 (FIG. 2B) for receiving a heat sink 28 (FIG. 2C). The heat sink 28 extends downward into the optical module opening 25 where it is in thermal contact with the optical module through the use of a spring clip 29. In one example, a QSFP or other form factor optical transceiver (e.g., low power optics) that does not require a heat sink may be installed into a closed top optical module cage 20 as shown in FIG. 2A. The cage 20 provides better EMI protection due to small ventilation holes and is good for low power modules as the airflow passes through the cage surface, which acts as a thermal barrier for the optical module.

FIGS. 2B and 2C illustrate examples of open top cages, which may be used without a heat sink (FIG. 2B) or with a heat sink 28 (FIG. 2C). If no heat sink is installed (FIG. 2B) and the port 25 is empty, significant airflow bypass may occur through the open top 27. The empty port 25 allows airflow to bypass from the open port through the top opening 27, thereby reducing airflow past adjacent modules and reducing cooling effectiveness.

The heat sink 28 is configured to maximize the surface area in contact with a cooling medium (e.g., air) surrounding the heat sink. The heat sink 28 transfers heat generated by the optical module where heat dissipation capability of the module is insufficient to moderate its temperature. As shown in FIG. 2C, the heat sink 28 comprises a set of fins, which allow excess thermal energy to dissipate into the environment by conduction and convection. The heat sink 28 carries heat away from the optical module and into the fins, which provide a large surface area for the heat to dissipate, thus cooling the heat sink and optical module. The heat sink 28 may, for example, be formed from copper, aluminum, or any other suitable material. It is to be understood that the shape or size of the heat sink or the configuration or number of fins may be different than shown herein.

When the optical module port 25 is empty, clearance between the heat sink 28 and cage 24 may be a source of EMI leakage (FIG. 2C). For example, due to mechanical assembly (e.g., clip 29 that allows movement during insertion and extraction of the optical transceiver) and tolerances of the heat sink 28 (e.g., flatness and other geometric tolerances), there may be an air gap between the heat sink and cage 24. An overhang heat sink may also create an air gap within empty ports 25 due to cantilever effects. This air gap may be a source of airflow and EMI leakage when the optical module port 25 is empty.

As previously described, an empty optical module port 25 may also lead to heat sink stability issues. Since the spring clip 29 allows for movement of the heat sink 28 during optical module insertion and extraction, vibration may cause the spring clip to loosen, resulting in heat sink detachment from the cage. The optical module plug 26 prevents movement of the clip 29, thereby providing improved structural protection for the heat sink 28 during MDVT and shipping and reducing the risk of heat sink detachment.

It is to be understood that the optical module form factors shown in FIGS. 1A-1C and the optical module cages shown in FIGS. 2A-2C and described herein are only examples and that the embodiments described herein may be used with a different configuration of ports or cages, and other standard form factor modules or future optical module designs may be used. For example, the optical module cage may include openings for receiving optical modules in a stacked or side-by-side arrangement (e.g., 2×1 (two rows with one module port in each row) (stacked), 1×2 (1 row with two module ports) (side-by-side) (FIG. 2C), 1×4 (1 row with four ports) (FIGS. 2A and 2B), 2×2 (two rows, two module ports in reach row), 2×4 (two rows, four module ports in each row), etc.). The term "stacked" as used herein refers to one module port positioned in a location vertically above another module and the term "side-by-side" as used herein refers to two module ports positioned horizontally adjacent to one another. It is to be understood that the terms above/below, upper/lower, top/bottom, horizontal/vertical, or front/rear as used herein are relative to the position of the cage and also cover other orientations of the cage. Thus, the terms are used only for ease of description and are not to be interpreted as limiting the arrangement of ports or components within an optical module cage. The optical module cage may be designed for compatibility with various optical form factors including SFP, QSFP, QSFPDD, OSFP, CFP, CPAK, or any other current or future form factor and the optical module plug may be configured to conform to any of the form factors described herein or other current or future form factors.

Figure 3A:
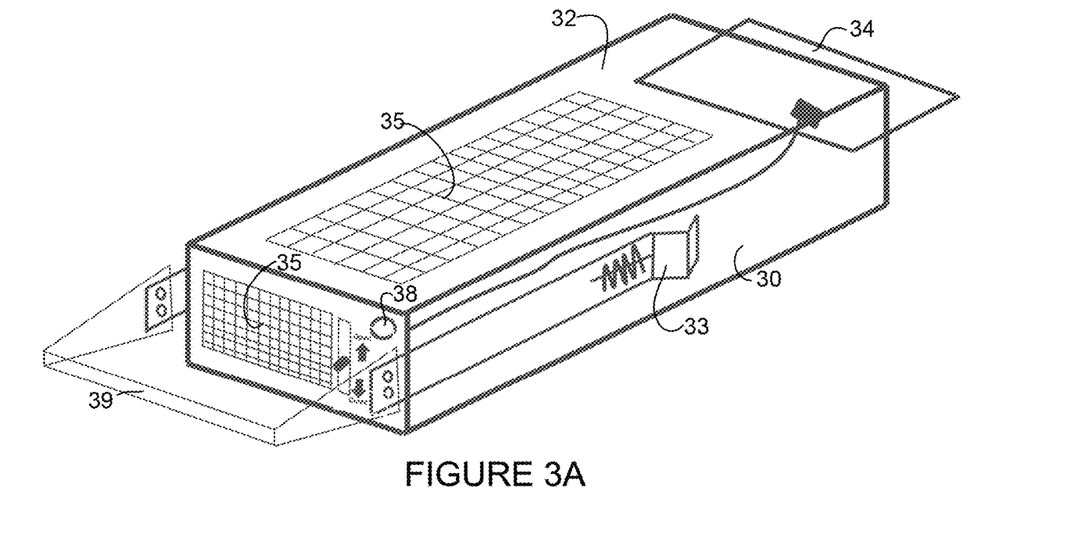
FIG. 3A is a perspective schematic of an optical module plug configured for active detection, in accordance with one embodiment.
Figure 3B:
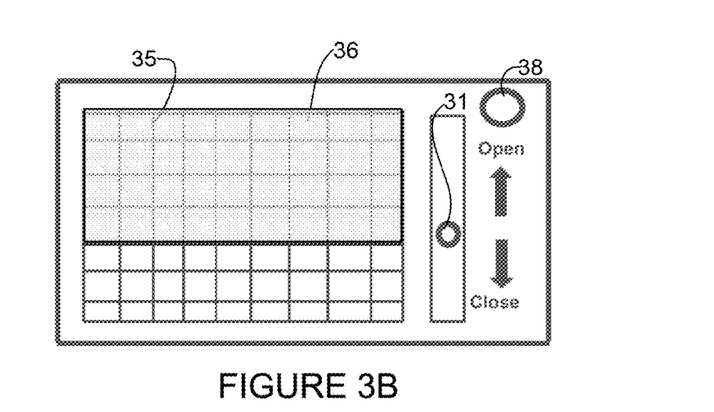
FIG. 3B is a front view of the optical module plug of FIG. 3A.
Figure 5A:
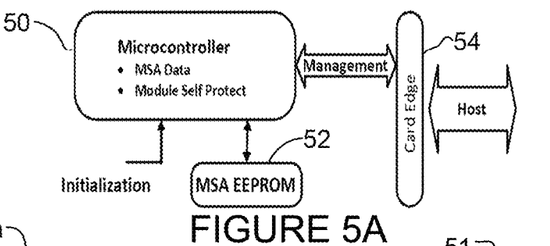
FIG. 5A is a block diagram illustrating an electrical interface between an active optical module plug and host, in accordance with one embodiment.
Figure 5B:
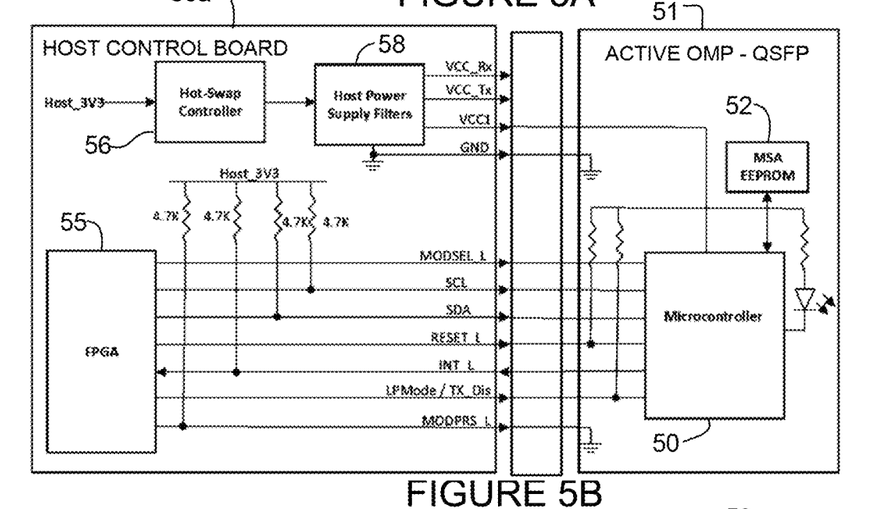
FIG. 5B is an electrical schematic of the interface shown in FIG. 5A for a QSFP (Quad Small Form-Factor Pluggable) port.
Figure 5C:
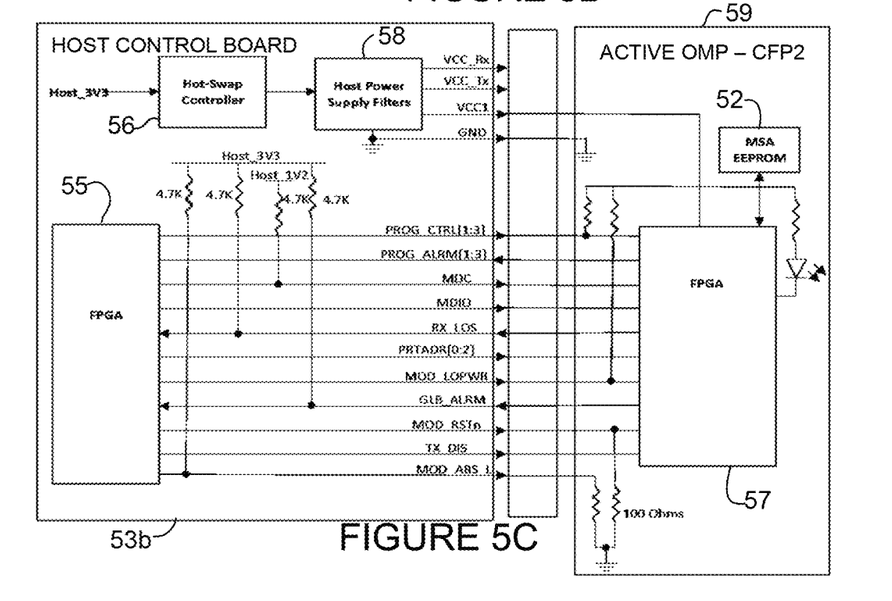
FIG. 5C is an electrical schematic of the interface for a CFP (C Form-Factor Pluggable) port.

FIGS. 3A and 3B schematically illustrate an example of an active optical module plug 30, in accordance with one embodiment. In one or more embodiments, the active optical module plug comprises a plug (plug body) 32 for insertion into an open optical module port on a network device configured to receive an optical transceiver, and an electrical connector 34 for connecting the plug to an optical module interface on the network device (e.g., as shown in FIGS. 5A-5C) and indicating to the network device insertion of the plug into the optical module port. The active optical module plug 30 is configured to actively indicate to the network device that the plug is installed in the optical module port through an electrical signal at an electrical interface (e.g., electrical connector 34).

A perspective of the active optical module plug 30 is shown schematically in FIG. 3A and a front view is shown in FIG. 3B. The active optical module plug 30 comprises the body (plug) 32 generally corresponding to the external form factor of the optical transceiver it is configured to replace and the electrical connector 34 (e.g., connector or PCBA (Printed Circuit Board Assembly)). In one or more embodiments, the active optical module plug 30 is detectable by electronics on the plug and includes the electrical connector 34 for mating with the host electrical interface configured to mate with the optical transceiver. The electrical connector 34 may be configured to identify installation of the optical module plug through use of shorted signal pins, for example. The electrical connector may comprise a microcontroller (e.g., for a CFP2 interface) or EEPROM (Electrically Erasable Programmable Read-Only Memory) (e.g., for QSFP28/ DD interface)).

As shown in FIGS. 3A and 3B, an upper surface and front surface of the optical module plug 30 may include ventilation holes 35 to allow airflow bypass if needed. The holes are optimized for electromagnetic compatibility (e.g., minimized opening) to be EMC (Electromagnetic Compatibility) compliant. In the example shown in FIGS. 3A and 3B, the front surface includes an adjustable screen 36 for adjusting the amount of airflow through the front face. As shown in FIG. 3B, the adjustable sliding screen 36 may be manually controlled by a knob 31 to reduce or increase the amount of airflow permitted to pass through the front face of the optical module plug 30. The screen 36 may also be electronically controlled by a microcontroller or other electronics (e.g., at connector 34) based on software commands delivered to a miniature motor or actuator operable to adjust the screen 36. For example, element 31 may represent an electro-mechanical motor or actuator coupled to the screen 36.

In one or more embodiments, an indicator (e.g., green LED (Light Emitting Diode)) may be included on a front face of the plug to provide an installation status of the optical module plug 30. For example, if the optical module plug 30 is properly inserted into the port as indicated by the electronics 34, the light 38 may be illuminated. As shown in FIG. 3A, a pull tab 39 and latch 33 (e.g., spring loaded member) may be included to conform to the applicable optical transceiver standard. The pull tab 39 may be used for insertion or removal of the plug 30 and the latch 33 helps to retain the plug within the port.

Figure 4A:
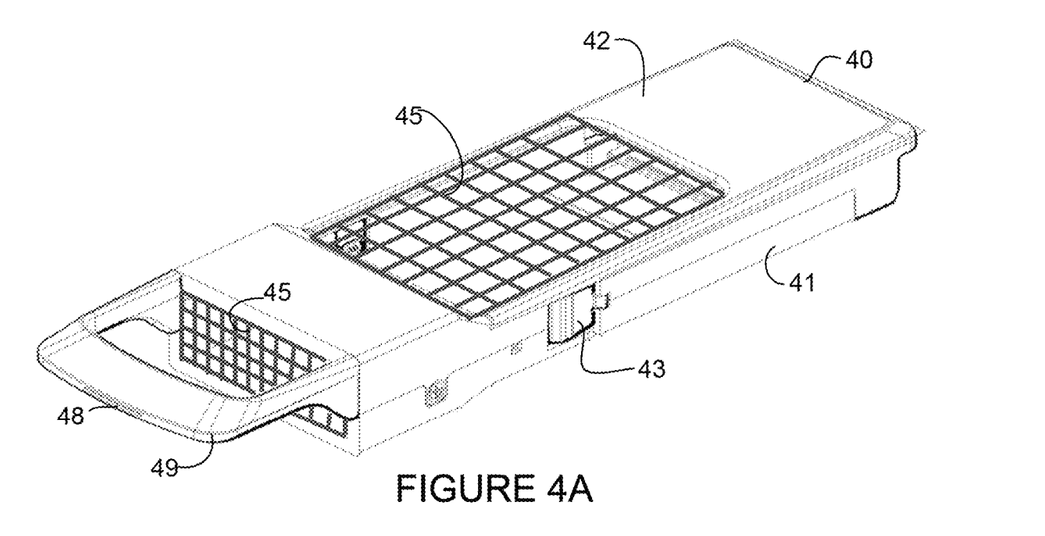
FIG. 4A is a perspective of an optical module plug configured for active detection, in accordance with one embodiment.
Figure 4B:
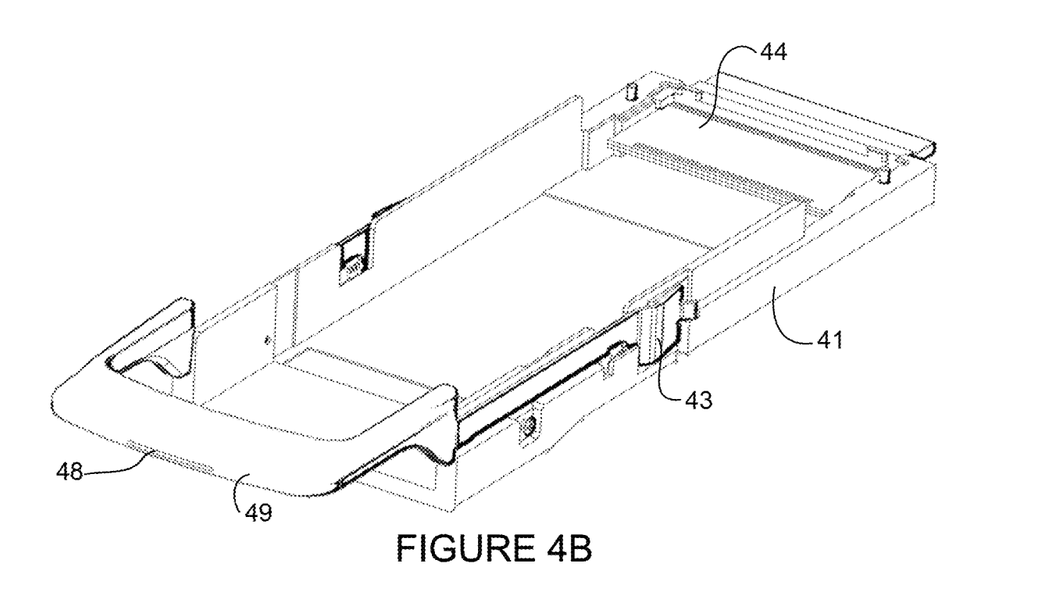
FIG. 4B is a perspective of the optical module plug of FIG. 4A with a top portion removed to show detail.

FIGS. 4A and 4B illustrate details of the active optical module plug construction, in accordance with one embodiment. In this example, the active optical module plug 40 includes a lower casing 41 and an upper casing 42. As previously noted, the plug 40 includes a pull tab 49 for removal and insertion of the plug and a latch 43 for retaining the plug within the port. The upper casing 42 is removed in FIG. 4B to show details of the electrical connector 44 (e.g., PCB (Printed Circuit Board) and plug assembly, microcontroller and LED connector). In the example shown in FIGS. 4A and 4B, a status light (indicator) 48 (e.g., LED) is located on the pull tab 49. EMC compliant ventilation holes 45 are included on a front and upper surface of the plug 40 and ventilation may be adjusted through movement of a screen, as previously described.

FIG. 5A is a block diagram illustrating an electrical interface between the active optical module plug and the host (e.g., line card). As described below with respect to FIG. 9, the network device (line card, host) identifies optical transceivers installed in optical module ports at the network device based on input received at electrical interfaces (54, 53*a*, 53*b*) at the network device. In the example shown in FIG. 5A, the optical module plug includes a microcontroller 50 comprising MSA (Multi-Source Agreement) data and module self-protect features. The microcontroller 50 receives initialization information and interacts with MSA EEPROM 52. Management communications take place between the optical module plug and host at the card edge 54 (host interface configured for operation with optical transceiver).

FIG. 5B is an example of an electrical circuit diagram for a QSFP active optical module plug (OMP) 51 and QSFP host control board 53*a*. The plug 51 includes the microcontroller 50 and MSA EEPROM 52. As previously described, the microcontroller 50 communicates with the host control board 53*a*, which may include, for example, FPGA (Field Programmable Gate Array) 55, hot-swap controller 56, and host power supply filters 58, as is well known by those skilled in the art.

FIG. 5C shows an electrical circuit for a CFP2 compatible optical module plug 59 and CFP2 host control board 53*b*. In this example, the plug 59 includes the MSA EEPROM 52 and an FPGA 57 for interface with the CFP2 compatible host control board 53*b*.

It is to be understood that the electrical circuits, layout, and components shown in FIGS. 5B and 5C are only examples, and changes may be made without departing from the scope of the embodiments.

Figure 6A:
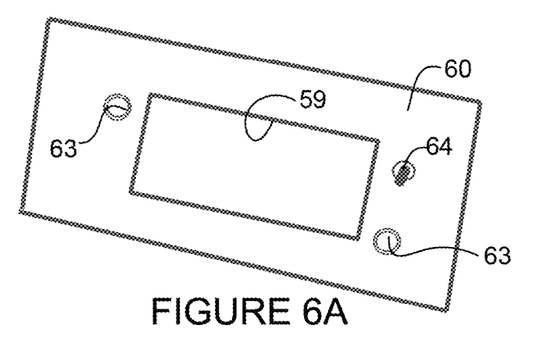
FIG. 6A is a schematic illustrating an optical module plug detection switch adjacent to an optical module port, in accordance with one embodiment.
Figure 6B:
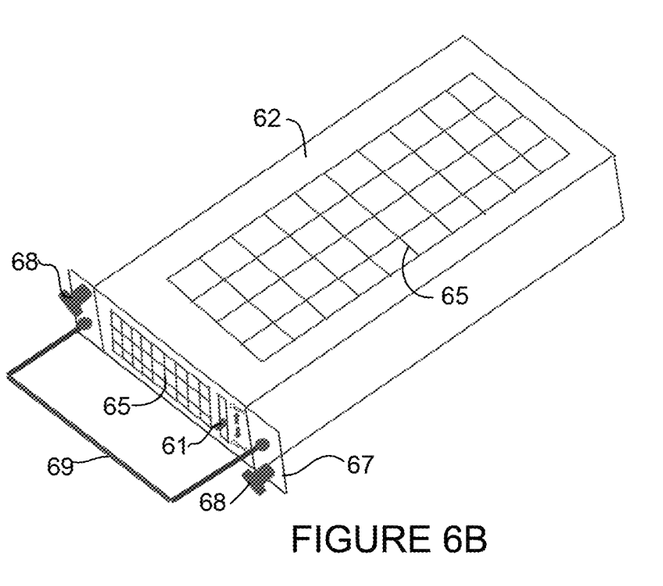
FIG. 6B is a perspective schematic of an optical module plug configured for passive detection by the optical module plug detection switch shown in FIG. 6A, in accordance with one embodiment.

In one or more embodiments, an optical module plug is configured for passive detection at the network device. The passive optical module plug does not include any electronics and is configured to interact with a switch (e.g., mechanical switch, sensor) on the line card, which is operable to send a signal indicating presence of the passive optical module plug in the optical module port. In one example, a passive optical module plug 62 is configured for insertion into an open optical module port 59 on a network device configured to receive an optical transceiver, and comprises a switch contact 67 for interface with a switch 64 on the network device to indicate insertion of the plug into the optical module port (FIGS. 6A and 6B). The passive optical module plug allows for identification of insertion of the plug 62 without the need for electronics at the plug. The plug may be formed from plastic or a hollow sheet metal enclosure since there are no active components with power dissipation. The network device may determine that the plug 62 is inserted into the optical module port 59 based on an electrical signal received from the switch 64, indicating insertion of the plug into the optical module port. As described in detail below, if neither an optical transceiver nor optical module plug is installed in the port, an alarm may be raised to indicate that the optical module port is open.

FIG. 6A schematically illustrates a front panel 60 of a line card with open port 59 for receiving an optical transceiver or passive optical module plug 62 (FIG. 6B). In this example, the front panel 60 includes threaded holes 63 for securely attaching the optical module plug 62 in the optical module port 59 and a mechanical switch 64 for engagement with a switch contact (tab) 67 on the optical module plug 62 when the plug is inserted into the port.

Figure 6C:
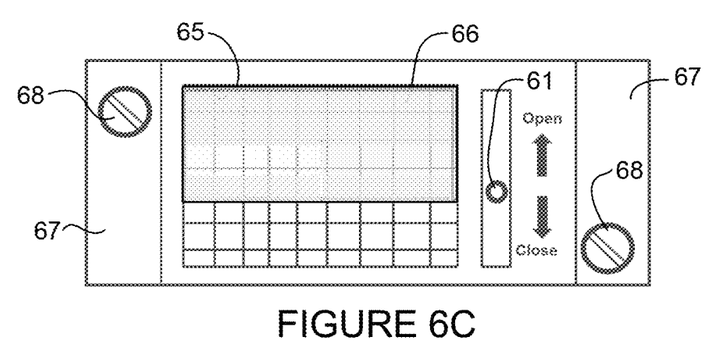
FIG. 6C is a front schematic of the optical module plug of FIG. 6B.

As shown in FIGS. 6B and 6C, the switch contact comprises a plate (tabs) 67 extending outwardly from a front surface of the plug. The plate 67 further comprises thumb screws 68 for insertion into the threaded holes 63 on the front panel 60 of the line card. As previously described, the plug 62 may include ventilation holes 65 on one or more surfaces of the plug body. The front surface extending from the optical module port may include adjustable ventilation holes with a sliding screen 66 manually operated with a lever 61 to optimize the airflow and prevent EMI leakage, as previously described. The plug 62 also includes a pull tab 69.

Figure 7A:
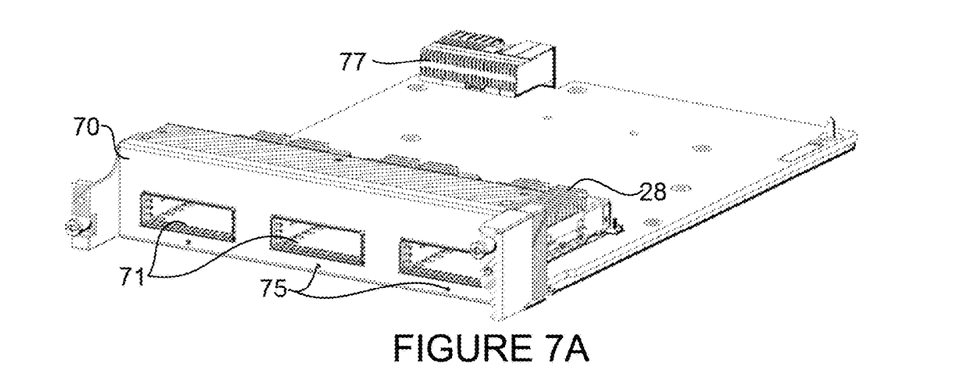
FIG. 7A is a perspective of a line card with optical module plug detection switches, in accordance with one embodiment.

FIG. 7A is a perspective of a line card 70 comprising three optical module ports 71 with a detection switch 75 located adjacent to each port for detecting installation of a passive optical module plug 72. The optical module ports (cages) are coupled to electronic components (e.g., one or more integrated circuit cards mounted on one or more circuit boards along with supporting components). The line card 70 may comprise one or more of the electronic components, heat sinks 28, and connector (e.g., backplane connector) 77. The electronic components and circuits may be operable to interface telecommunication lines (e.g., copper wire, optical fibers) in a telecommunications network. The line card 70 may be configured to perform one or more operations and receive any number or type of pluggable transceiver modules configured for transmitting and receiving signals, and may be configured for operation in any type of chassis or network device (e.g., router, switch, gateway, controller, edge device, access device, aggregation device, core node, intermediate node, or other network device).

Figure 7B:
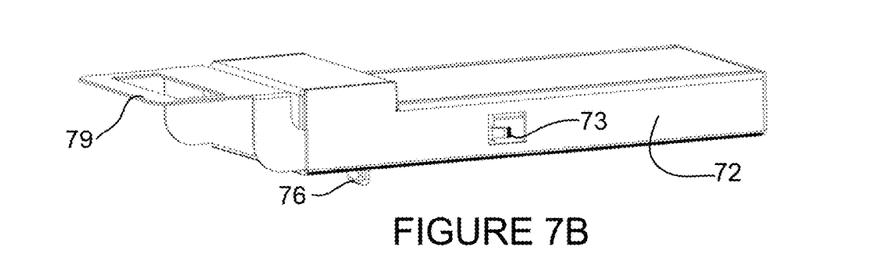
FIG. 7B is a perspective of an optical module plug with a switch contact, in accordance with one embodiment.
Figures 7C, 7D:
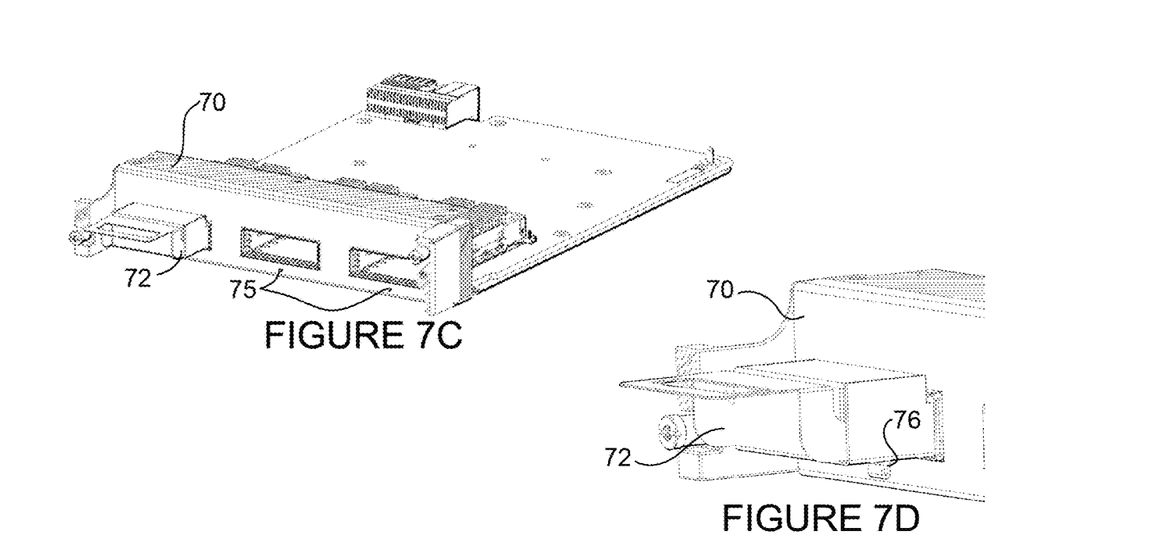
FIG. 7C is a perspective of the line card of FIG. 7A with the optical module plug of FIG. 7B inserted into an open port.
FIG. 7D is an enlarged partial view of FIG. 7C showing the switch contact of the optical module plug engaged with the optical module plug detection switch on the line card.

In the example shown in FIGS. 7A-7D, the line card 70 includes the mechanical detection switch 75 operable to transmit a signal indicating installation of the plug 72 upon insertion of the plug into the port 71. FIG. 7B is a perspective of the passive optical module plug 72, in accordance with one embodiment. As previously described, the plug 72 may also comprise ventilation holes if needed. The plug 72 includes a latch 73 for retaining the plug within the port 71 and a pull tab 79 for inserting and removing the plug. The plug 72 further comprises a switch contact (tab) 76 extending from a lower surface of the plug and aligned with the contact switch 75 when the plug is inserted into the port opening 71, as shown in FIGS. 7C and 7D. When the plug 72 is properly inserted into the optical module port 71, the switch contact 76 on the plug engages a movable actuator, thereby activating the switch, which sends a signal to indicate installation of the plug in the port.

The switch may comprise a mechanical switch as shown in FIG. 7A and described above, a sensor, or any other device operable to detect presence (installation) of the plug. In one example, the switch comprises a proximity detector comprising an optical sensor, ultrasonic sensor, IR (Infrared) sensor, inductive sensor, capacitive sensor, photo-electric sensor, magnetic sensor, or any other suitable sensor. The plug itself (e.g., plug body or frame) may be considered the switch contact for use with a proximity sensor, for example.

Figure 8:
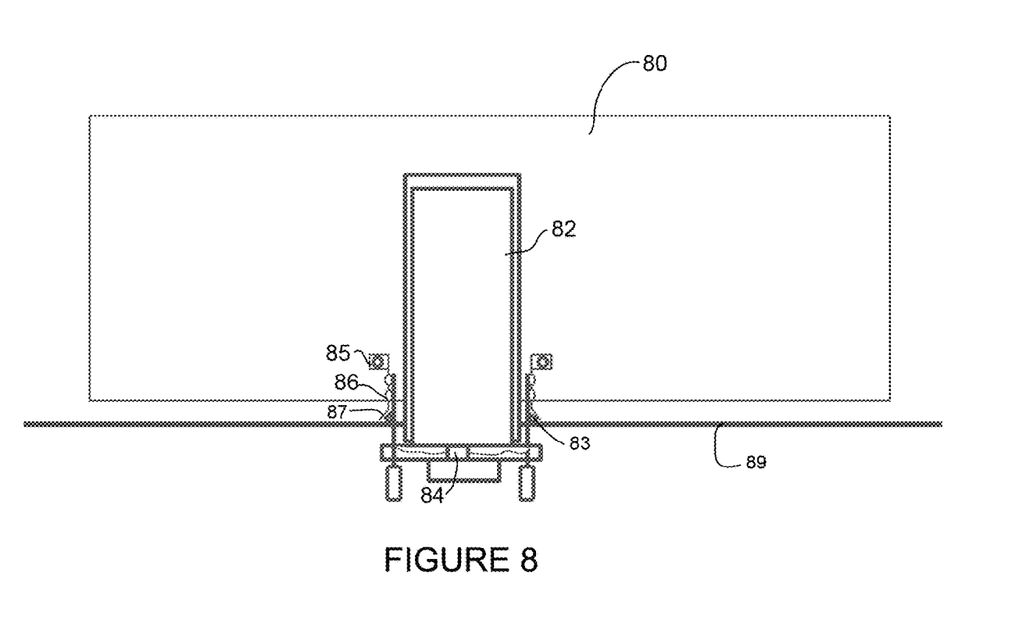
FIG. 8 is a top schematic view of an optical module plug inserted into a line card with an optical module plug detection sensor, in accordance with one embodiment.

FIG. 8 is a top schematic view of a line card 80 configured with a presence detection circuit comprising an electrical conductive circuit connecting a switch 85 to strain gauges 86 attached to a metal plate 87. The strain gauges 86 sense the presence of the plug 82 and activate the switch 85. The plug 82 may be configured with a locking tab 83 for contact with a front panel 89 of the line card. The plug 82 may also include an LED 84 to identify proper installation of the plug, as previously described.

Figure 9:
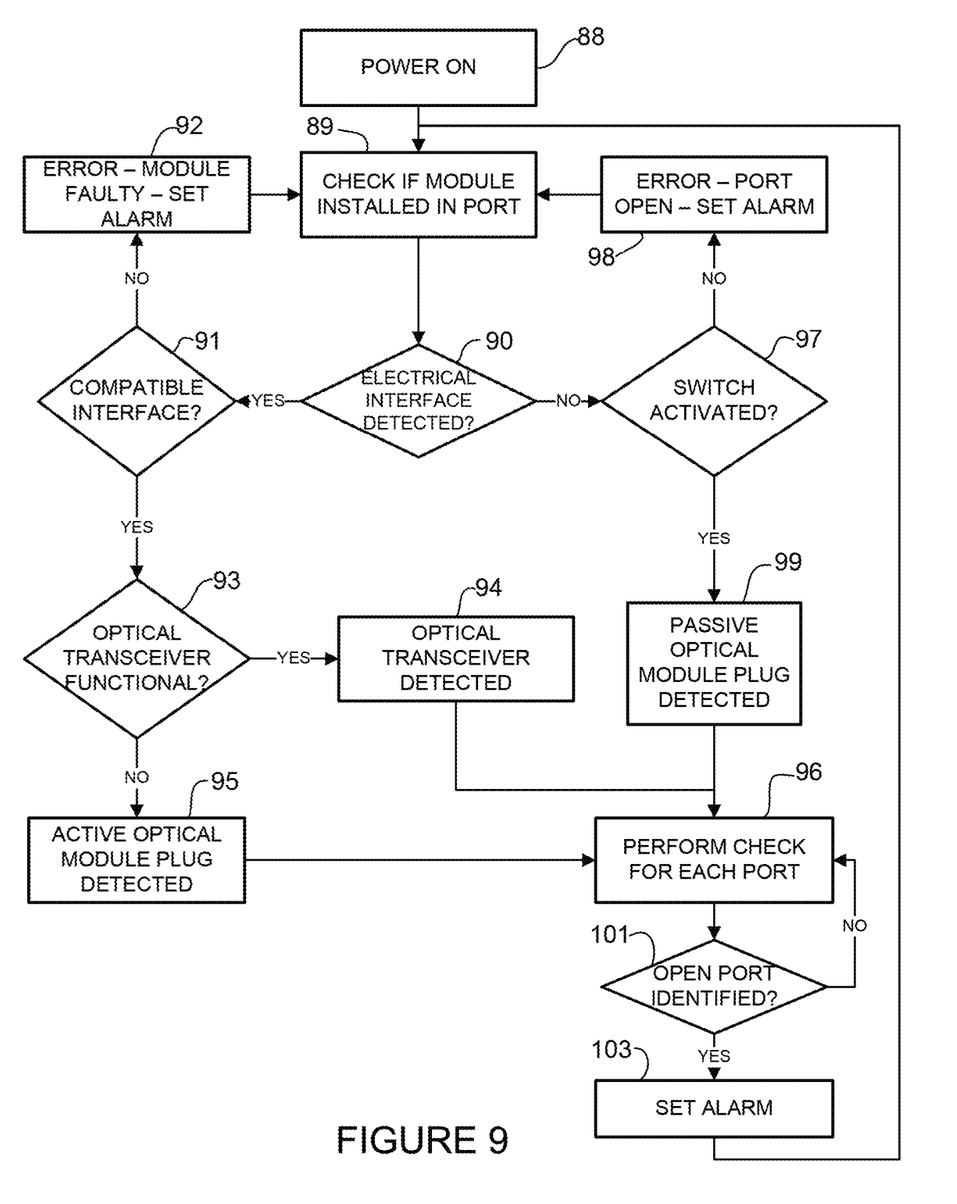
FIG. 9 is a flowchart illustrating a process for detecting and identifying a module installed in an optical module port, in accordance with one embodiment.

FIG. 9 is a flowchart illustrating a process for detecting and identifying a module inserted in an optical module port, in accordance with one embodiment. The process shown in FIG. 9 and described below may be performed for each optical module port on a line card or network device. The system may identify optical transceivers installed in optical module ports based on input received at electrical interfaces at the network device, identify at least one optical module port without an optical transceiver installed, determine if a plug is inserted into the optical module port (e.g., based on an electrical signal received from an electrical connector on an active optical module plug or from a switch sensing a passive optical module plug), and raise an alarm if the optical module port is open (i.e., no optical transceiver or plug installed). If the plug is properly installed, a status light may be illuminated on the line card. As previously described, one or more optical module plugs (active or passive) may be inserted into one or more empty ports to reduce airflow bypass, electromagnetic interference leakage, and contamination without the optical transceiver installed in the optical module port.

When the network device is powered on (step 88), the system (e.g., detector/controller on line card or network device) detects if a module (transceiver or optical module plug) is inserted into an optical module port (step 89). The system may for example, determine if an electrical interface is detected (step 90). This may be identified, for example, by a signal received at an electrical interface at the host. As previously described with respect to FIG. 5A, the active optical module may transmit a signal to the host, or an optical transceiver may transmit a signal. The host then attempts to identify the module and determine if the module is compatible with the system (step 91). If the module cannot be identified or is determined not to be compatible, a module fault error occurs and an alarm is set (step 92). If the module is identified as a functioning optical transceiver (steps 93 and 94), the module is registered and normal operation takes place at the optical module port. If a functioning optical transceiver is not detected (step 93), the module is identified as an active optical module plug (steps 93 and 95).

If an electrical interface is not detected at step 90, the system checks whether a switch (e.g., mechanical switch, sensor) has been activated (step 97). If the switch is activated, a passive optical module plug is detected (steps 97 and 99). As previously, described activation of the switch may comprise engagement of a switch contact on the plug with the switch or sensing of installation of the plug at a proximity sensor, for example. Activation of the switch results in an electrical signal indicating insertion of the plug being transmitted to a plug detector/controller. If the switch has not been activated (step 97), an error occurs and an empty port alarm is set for the optical module port (step 98). The system may periodically perform the check for a module (e.g., scan every ten seconds following an error or every five minutes during normal operation, or any other interval).

This process may be repeated for each optical module port (step 96). Each port may be checked simultaneously or sequentially at power up or periodically checked. If any open ports are identified (step 101), an alarm is set (step 103) to indicate that an optical module plug is needed at one of the ports.

It is to be understood that the process shown in FIG. 9 and described above is only an example and steps may be modified, combined, removed, or added without departing from the scope of the embodiments. For example, if the optical module port is only configured for receiving active optical module plugs, step 97 may be removed. If the optical module is only configured for receiving passive optical module plugs, step 95 may be removed and a result of "no" at step 93 would lead to step 92.

Figure 10:
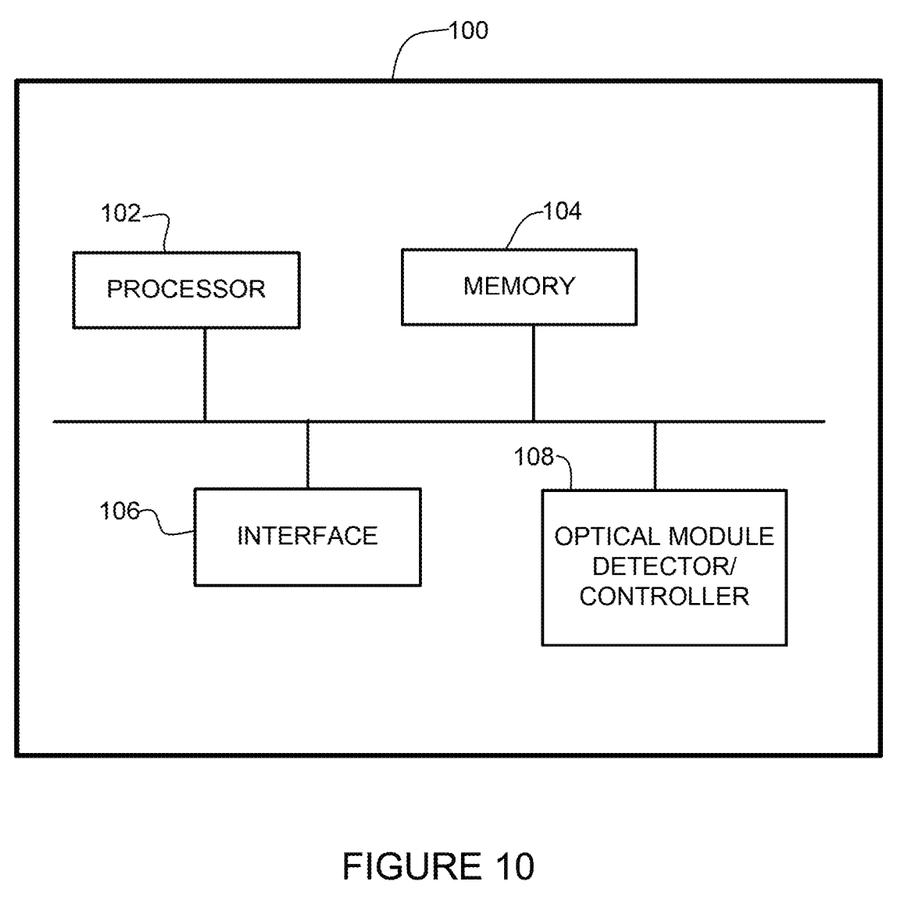
FIG. 10 is a block diagram depicting an example of a network device in which the embodiments described herein may be implemented.

In one or more embodiments, the optical module plugs described herein may be located within a line card installed in a network device 100 as shown in FIG. 10. The network device 100 may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), wireless network, enterprise network, corporate network, data center, Internet, intranet, radio access network, public switched network, or any other network).

The network device 100 may include any number or type of line cards, with each line card comprising any number or configuration of optical module ports for receiving optical transceivers or in the case of empty ports, optical module plugs described herein. In one embodiment, the network device 100 is a programmable machine that may be implemented in hardware, software, or any combination thereof. The network device 100 includes one or more processor 102, memory 104, network interface (port) 106, and optical module (transceiver, plug) detector/controller 108 (e.g., code, software, logic, element, module, or device).

Memory 104 may be a volatile memory or non-volatile storage, which stores various applications, operating systems, modules, and data for execution and use by the processor 102. The network device 100 may include any number of memory components.

Logic may be encoded in one or more tangible media for execution by the processor 102. For example, the processor 102 may execute codes stored in a computer-readable medium such as memory 104. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The network device 100 may include any number of processors 102, which may perform one or more operations shown in the flowchart of FIG. 9.

The network interface 106 may comprise any number of interfaces (line cards, ports) for receiving data or transmitting data to other devices. The network interface 106 may include, for example, an optical interface at an optical module.

The detector/controller 108 may comprise one or more components including, for example, a switch at the host for use in determining if a passive optical module plug is installed in the optical module port and logic for determining the status of a port (e.g., optical transceiver installed, optical module plug installed, open) based on a signal received from the optical transceiver, active optical module plug, or switch, or lack of a signal. The controller may signal an alert if no transceiver or optical module plug is detected.

It is to be understood that the network device 100 shown in FIG. 10 and described above is only an example and that different configurations of network devices may be used. For example, the network device 100 may further include any suitable combination of hardware, software, algorithms, processors, devices, components, or elements operable to facilitate the capabilities described herein.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a plug for insertion into an optical module port on a network device configured to receive an optical transceiver; and
   an electrical connector for connecting the plug to an optical transceiver interface on the network device and identifying insertion of the plug into the optical module port;
   wherein insertion of the plug into the optical module port reduces airflow bypass, electromagnetic interference leakage, and contamination without the optical transceiver installed in the optical module port.

2. The apparatus of claim 1 wherein the electrical connector comprises a microcontroller.

3. The apparatus of claim 1 wherein the electrical connector comprises programmable memory.

4. The apparatus of claim 1 wherein the electrical connector comprises shorted signal pins.

5. The apparatus of claim 1 further comprising a status light for indicating proper insertion of the plug into the optical module port.

6. The apparatus of claim 1 wherein a front surface and an upper surface of the plug comprise ventilation holes.

7. The apparatus of claim 1 wherein a front surface of the plug extending from the optical module port when the plug is inserted into the optical module port comprises a movable screen for adjusting said airflow bypass through ventilation holes.

8. The apparatus of claim 1 wherein at least a portion of a surface of the plug comprises a movable screen for adjusting said airflow bypass through ventilation holes and wherein said movable screen is electronically controlled.

9. The apparatus of claim 1 wherein the plug is configured to stabilize a heat sink attached to an optical module cage comprising the optical module port.

10. An apparatus comprising:
    a plug for insertion into an optical module port on a network device configured to receive an optical transceiver; and
    a switch contact for interface with a switch on the network device to indicate insertion of the plug into the optical module port;
    wherein insertion of the plug into the optical module port reduces airflow bypass, electromagnetic interference leakage, and contamination without the optical transceiver installed in the optical module port.

11. The apparatus of claim 10 wherein the switch comprises a mechanical switch on a front surface of the network device and wherein the switch contact comprises a tab on the plug aligned to engage the mechanical switch with the plug inserted into the optical module port.

12. The apparatus of claim 10 wherein the switch comprises a sensor and the switch contact comprises a frame of the plug.

13. The apparatus of claim 10 wherein a portion of a surface of the plug comprises ventilation holes.

14. The apparatus of claim 13 further comprising a movable screen for adjusting said airflow bypass through the ventilation holes.

15. The apparatus of claim 14 wherein the movable screen is electronically controlled.

16. A method comprising:
   identifying optical transceivers installed in optical module ports at a network device based on input received at electrical interfaces at the network device;
   identifying at least one optical module port without an optical transceiver installed;
   determining if a plug is inserted into the optical module port, wherein an electrical signal indicates insertion of the plug into the optical module port; and
   raising an alarm if the optical module port is open;
   wherein insertion of the plug into the optical module port reduces airflow bypass, electromagnetic interference leakage, and contamination without the optical transceiver installed in the optical module port.

17. The method of claim 16 wherein determining if the plug is inserted into the optical module port comprises receiving said electrical signal from an electrical connector on the plug at one of the electrical interfaces.

18. The method of claim 16 wherein determining if the plug is inserted into the optical module port comprises receiving said electrical signal from a switch on the host, wherein the plug comprises a switch contact engaged with the switch when the plug is inserted into the optical module port to activate the switch.

19. The method of claim 16 further comprising illuminating a status light upon insertion of the plug into the optical module port.

20. The method of claim 16 wherein the plug comprises ventilation holes on at least a portion of a surface of the plug, said ventilation holes optimized for electromagnetic compatibility.

* * * * *